United States Patent
Gatchalian et al.

(10) Patent No.: US 8,591,700 B2
(45) Date of Patent: Nov. 26, 2013

(54) SUSCEPTOR SUPPORT SYSTEM

(75) Inventors: Roy G. Gatchalian, Singapore (SG); Joseph Gregorio Soriano, Singapore (SG); Hee Cher Heng, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 521 days.

(21) Appl. No.: 12/859,766

(22) Filed: Aug. 19, 2010

(65) Prior Publication Data
US 2012/0042823 A1    Feb. 23, 2012

(51) Int. Cl.
*B05C 13/00*    (2006.01)

(52) U.S. Cl.
USPC ...... 156/345.51; 118/500; 118/728; 414/935; 414/936; 414/941

(58) Field of Classification Search
USPC .............. 156/345.51; 118/728, 500; 414/935, 414/936, 937, 938, 939, 940, 941
See application file for complete search history.

(56) References Cited

U.S. PATENT DOCUMENTS

| | | | |
|---|---|---|---|
| 4,496,609 A | 1/1985 | McNeilly et al. | |
| 5,044,943 A | 9/1991 | Bowman et al. | |
| 5,318,634 A | 6/1994 | deBoer et al. | |
| 5,820,685 A | 10/1998 | Kurihara et al. | |
| 6,293,749 B1 * | 9/2001 | Raaijmakers et al. | 414/609 |
| 6,395,085 B2 * | 5/2002 | Dietze et al. | 117/29 |
| 6,692,576 B2 * | 2/2004 | Halpin et al. | 118/730 |
| 6,893,507 B2 | 5/2005 | Goodman et al. | |
| 7,169,234 B2 | 1/2007 | Weeks et al. | |
| 7,655,093 B2 | 2/2010 | Halpin et al. | |
| 2007/0056150 A1 * | 3/2007 | Weeks et al. | 29/25.01 |
| 2012/0042823 A1 * | 2/2012 | Gatchalian et al. | 118/500 |

FOREIGN PATENT DOCUMENTS

EP    0957185 A2    11/1999

\* cited by examiner

*Primary Examiner* — Sylvia R MacArthur
(74) *Attorney, Agent, or Firm* — Seed IP Law Group PLLC

(57) ABSTRACT

The present disclosure is directed to a susceptor support that includes a hub and a plurality of arms extending radially from the hub, where each arm has a terminal end positioned away from the hub. The susceptor support also includes a plurality of elongated rectangular tips formed at the terminal end of each arm, each tip having a length and a width, wherein the length is greater than the width.

16 Claims, 8 Drawing Sheets

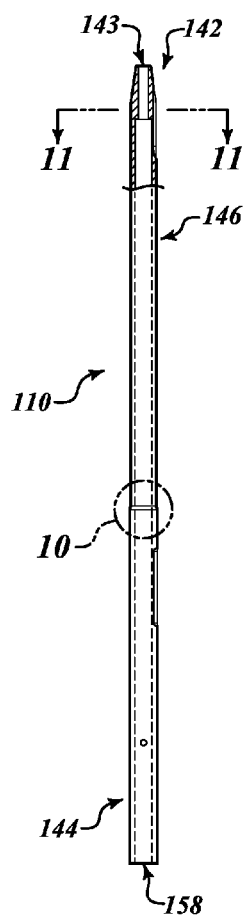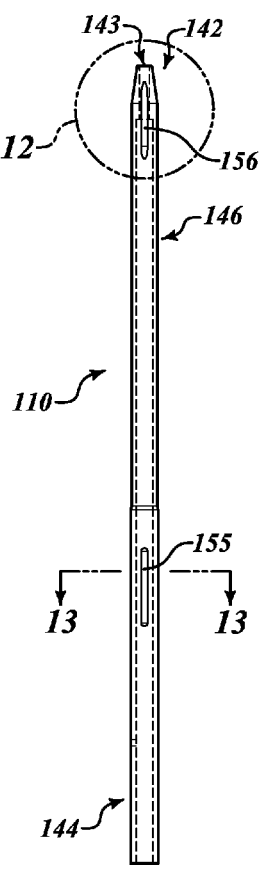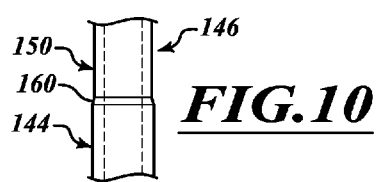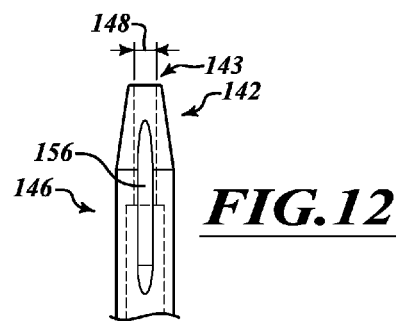

SUSCEPTOR SUPPORT SYSTEM

BACKGROUND

1. Technical Field

The present disclosure relates generally to a susceptor support system used in a semiconductor processing chamber.

2. Description of the Related Art

One of the more common silicon manufacturing processes is a chemical process known as CVD, or chemical vapor deposition. By the chemical vapor deposition process, thin layers of chemical material such as silicon and silicon compounds are deposited upon a wafer by exposing the wafer to the vaporized chemical at high temperature in a reactor chamber. This process generally produces high purity and high performance solid materials.

A chemical vapor deposition generally takes place in a reaction chamber. There are many reaction chamber designs and configurations, each with a different method for performing the fundamental operations, which are: dispensing gases, controlling temperature, and removing byproducts. Gases dispensed into the chamber react not only with materials on a surface of the wafer, but also with walls of the heated chamber wall. This later reactions tend to produce contaminants, which can affect the purity of the chemical deposition on the wafer. To reduce such contaminants, the heat must be localized to the wafer while keeping the walls cool. For example, in U.S. Pat. No. 4,496,609 to McNeilly et al. discloses the use of high intensity lamps and radiant energy to heat the wafer instead of using radio frequency energy.

In the reaction chambers that use radiant energy, the wafer of interest is generally placed on a susceptor which is supported by a susceptor support (also commonly known as a "spider"). FIG. 1 is a simplified view of a chemical vapor deposition machine 100 having a reaction chamber 102. In the reaction chamber 102, a wafer 104 is subjected to a deposition process. Through a chemical reaction between gas applied to the chamber 102 and the material on the wafer 104, an additional layer is formed on the wafer 104.

This chemical reaction also requires the application of heat, which is provided to the wafer 104 through a susceptor 6. The susceptor 6 is supported by a susceptor support 8. The susceptor support 8 is configured to be received by a rotatable shaft 10 that is coupled to a motor 112.

The chemical vapor deposition machine receives a cassette 114 carrying a plurality of wafers 104. The plurality of wafers is transported from other machines in the wafer formation process. A robotic arm 116 grabs the wafer 104 from the cassette 114 and transports the wafer into the reaction chamber 102. A plurality of pipes 117 provide the reaction gases into the chamber and also create vacuum conditions by removing ambient air from the chamber 102.

Once positioned on the susceptor, the wafer is heated and a layer or layers of material are chemically deposited thereon. Not shown in the figure are heating elements and a thermocouple. The thermocouple fits a hollow area or interior cavity inside the rotatable shaft. The thermocouple is coupled to the motor to detect temperature changes during the deposition process.

As reactant gas enters the heated chamber, chemical deposition process starts on the wafer 10 as the gas reacts with the material already on the wafer. The thermocouple monitors the temperature of the region under the susceptor, and as necessary to provide uniform heating to the wafer. The susceptor support, being in contact with the susceptor, would then also rotate the susceptor. Even heating of the wafer ensures uniform deposition, less contamination, and less warping of the wafer.

The susceptor 6 may be made of graphite or other opaque material suitable to allow even heating of the wafer placed upon it. As the chamber is heated to high temperature, the susceptor 6 uniformly transfers the heat by to the wafer 104. To ensure even deposition of chemical across the wafer surface, an even temperature across this surface has to be controlled.

On occasions, the wafer may therefore be rotated, and such rotation is generally accomplished through the rotation of the susceptor 6 by the susceptor support 8. The susceptor support engages the susceptor itself through rotationally and horizontally applied forces through ends in direct contact with the susceptor. The susceptor support 8 is capable of turning the susceptor 6 along a central axis as the susceptor support 8 itself is rotated by the shaft 10 on which it sits. This shaft 10, in turn, is rotated by the motor 112 that is part of the reaction chamber 102 itself. In general, the susceptor support 8, and thus the susceptor 6 itself, is rotated throughout the process, and in some embodiments, may be rotated up to 35 revolutions per minute.

A variety of susceptors 6 are used in the industry. The susceptors, typically made of graphite, have various sizes and features that impact how they are supported in the reaction chamber. Some susceptors have a plurality of indentations formed in a back surface of the susceptor. The indentations are formed to receive cylindrical ends of the susceptor supports. In order to align and adequately support the susceptor, the cylindrical ends must be perfectly aligned in the indentations.

Other susceptors have a smooth back surface that is configured to be supported by a susceptor support having a continuous circular ring of quartz that makes contact with the back surface. Over time the susceptor supports are damaged by the processes in the reaction chamber 102. Because of the adverse conditions in the reaction chamber 102, many susceptor supports are made of quartz. Quartz is particularly resistant to degradation caused by heat and by chemicals, like hydrochloric acid, in the reaction chamber. However, repeated exposure does structurally impact the quartz. Forming the circular ring of quartz is expensive and complicated because the quartz is somewhat fragile.

Accordingly, the cylindrical ends described above will weaken and change shape during the processes in the reaction chamber. The change in shape can cause the susceptor to wobble or otherwise become unstable. The instability negatively impacts the uniformity of the layer formed on the wafer 104. Also, the susceptor supports formed as a circular ring of quartz are degraded during these processes. The quartz may degrade unevenly and cause the susceptor to be unstable.

FIG. 2 is an example of a known tip 101 formed on an arm 118 of the susceptor support 8. The tip 101 is a cube such that all sides of the tip are squares. The tip 101 has a flat contact surface configured to fit into a recess on a back surface of the susceptor 8. After several wafer runs, edges of the tip 101 deform and form curves surfaces that cause the susceptor 8 to wobble or slip as the susceptor support tries to turn the susceptor.

Other problems occur with the quartz in the reaction chamber 102. For example, where the shaft 10 couples to the susceptor support 8. Some designs have a tapered end on the shaft that is forced into an opening in the susceptor support 8. The susceptor support 8 is positioned on the tapered end of the shaft 10 and then knocked into place, forcing the shaft and the susceptor support together. This procedure is prone to breakage. Also, with time in the reaction chamber the two surfaces forced together begin to slip. When this slipping occurs, the shaft 10 no longer turns the susceptor support reliably and therefore does not adequately turn the susceptor.

Efforts have been made to mitigate this rotational slippage. In U.S. Pat. No. 7,169,234 to Weeks et al. shaft having a flat surface in the tapered end is provided. The flat surface works with a retaining member formed on the susceptor support and an independent retaining member to positively secure the susceptor support to the shaft. The independent retaining member is fragile, difficult to manufacture, and easily misplaced. Also, this independent retaining member is affected by the hydrochloric gas in the deposition chamber, which weakens this small part. Once weakened, this independent retaining member can break or otherwise fail to keep the susceptor and the shaft from slipping.

BRIEF SUMMARY

In one embodiment of the present disclosure, a susceptor support device is provided for use in a deposition chamber to provide stability and to rotate a susceptor to ensure even heating of a wafer placed upon the susceptor. The susceptor support device includes a susceptor support and a rotatable shaft. The shaft is an elongated quartz cylinder having a first end configured to be received by a motor and a second end configured to receive the susceptor support.

The susceptor support includes a hub with a plurality of arms extending from the hub. Each arm extends radially away from the hub and has an elongated rectangular tip at a terminal end. Each tip has the elongated rectangular shape with a length, a width, and a height. The length of the tip is greater than the width of the tip. In one embodiment, a ratio of the length to the width may be 1 to 3 and a ratio of the length to the height may be 1 to 3. The tips fit into a grove on a bottom surface of a susceptor to support and turn the susceptor in a deposition chamber. The hub includes a ridge on an interior surface that is configured to interact with a groove on the second end of the shaft. The susceptor support is also formed from quartz.

Quartz is resistant to heat degradation and resistant to the chemicals used in the deposition process. However, with extended exposure to hydrocholoric (HCL) gas and extreme temperature, small features of the susceptor support and the shaft degrade, which can impact support stability. For example, edges of the tips can become rounded and a top surface of the tips that contacts the susceptor can be etched or eroded away. Also, the surfaces of the hub and the shaft that interact can become smooth so that it is difficult to turn the susceptor support with the shaft. Reduced friction between the hub and shaft influences the rotation generated by the motor and negatively impacts the deposition process.

In chambers utilizing radiant heat, quartz is used as the susceptor support materials due to quartz's ability to stay cool in extreme heat and high resistance to chemical weathering. But after a certain number of uses and repeated exposure to chemical gases, the quartz susceptor support experiences degradation and generally has to be periodically replaced with a new one.

Previous susceptor support and shaft designs may undergo up to 5,000 processes or depositions before degradation is noted. As described above, this degradation may occur at the contact area between the tip of the susceptor support and the susceptor itself, or at the contact area between the susceptor support and the rotatable shaft. One embodiment of the present disclosure is the susceptor support and system design that extends the life of the susceptor support system beyond 5,000 processes while still ensuring stability in holding up the susceptor and eliminating wobbling while turning. For example, the susceptor support having tips with a length longer than a width can extend the operational life of the susceptor support to be more than 10,000 wafer runs.

Another embodiment of the present disclosure is a susceptor support system that includes a susceptor support and a rotatable shaft coupled to the susceptor support. The hub and rotatable shaft form a locking mechanism by means of a ridge and grove mechanism. The hub includes the ridge on an interior surface of the hub. The ridge is sized and shaped to slide into the grove formed on the shaft. Although generally the surface of the hub's interior and the surface of the shaft are precisely machined to ensure tight mating, rotational slippage between these mating surfaces still occur due to wear, friction and possibly chemical vapor. Such rotational slippage can also contribute to wobbling to the susceptor, which in turn cause uneven deposition.

The elongated tips and locking mechanism between the hub and rotatable shaft enable longer period of usage between replacements, and thus provide cost savings.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIG. 7 is a side view of a shaft in accordance with an embodiment of the present disclosure;

FIG. 8 is a side view of the shaft in FIG. 7;

FIG. 9 is a top view of the shaft in FIG. 7;

FIG. 10 is an enlarge side view of the shaft in FIG. 7;

FIG. 11 is a cross-sectional view of the shaft in FIG. 7 taken through 11-11;

FIG. 12 is an enlarged side view of the shaft of FIG. 7;

FIG. 13 is a cross-sectional view of the shaft in FIG. 8 taken through 13-13;

DETAILED DESCRIPTION

Figure 1:
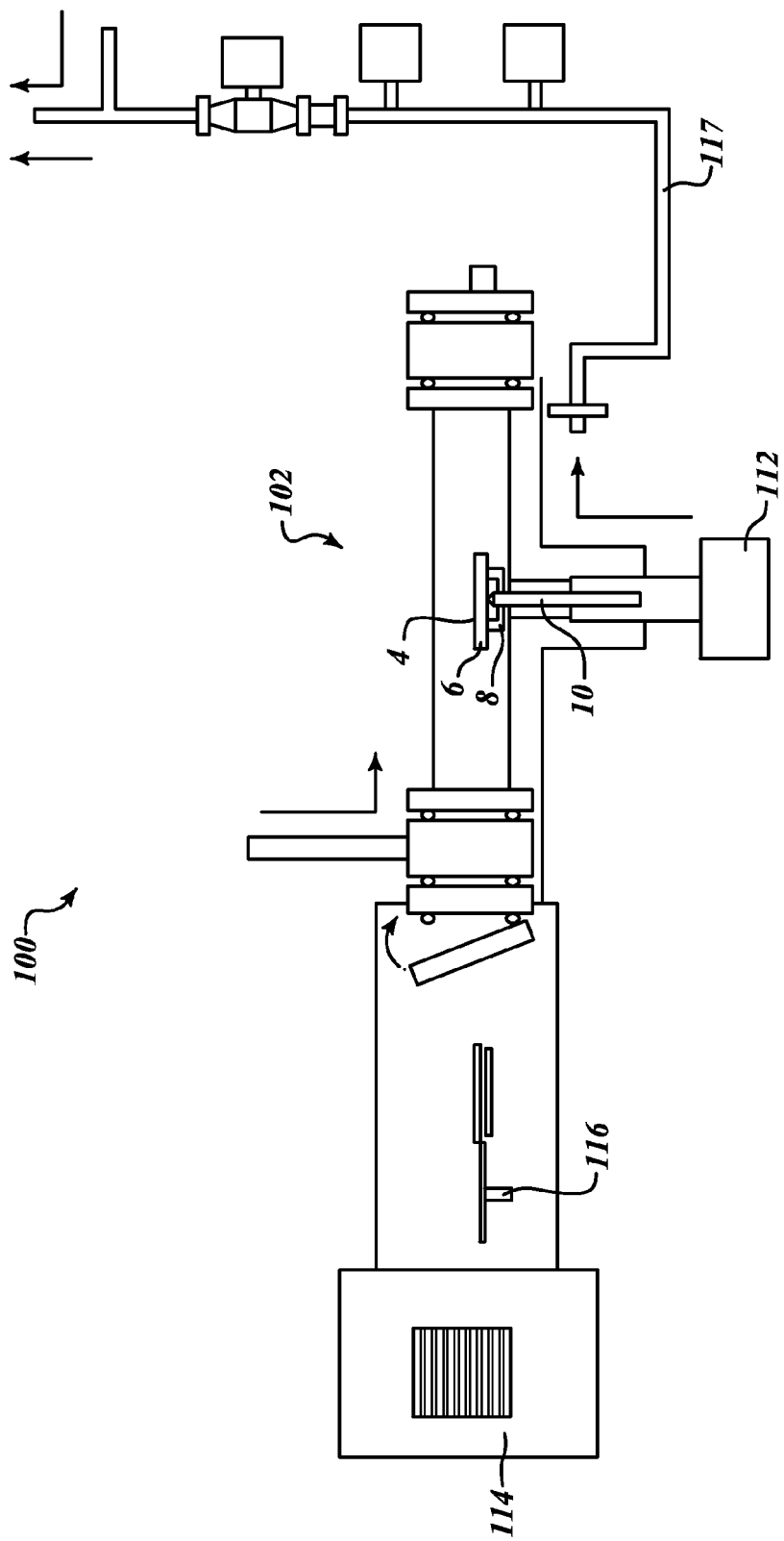
FIG. 1 is a simplified schematic of a chemical vapor deposition chamber.
Figure 2:
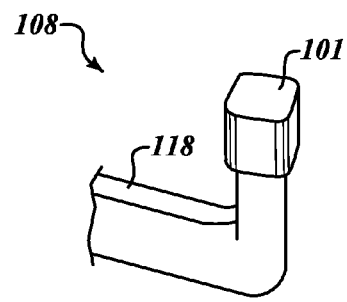
FIG. 2 is an enlarged view of a known tip of a susceptor support for use in the deposition chamber of FIG. 1.

In the following description, certain specific details are set forth in order to provide a thorough understanding of various embodiments of the disclosure. However, one skilled in the art will understand that the disclosure may be practiced without these specific details. In some instances, well-known structures associated with the chemical vapor deposition chambers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Figure 3:
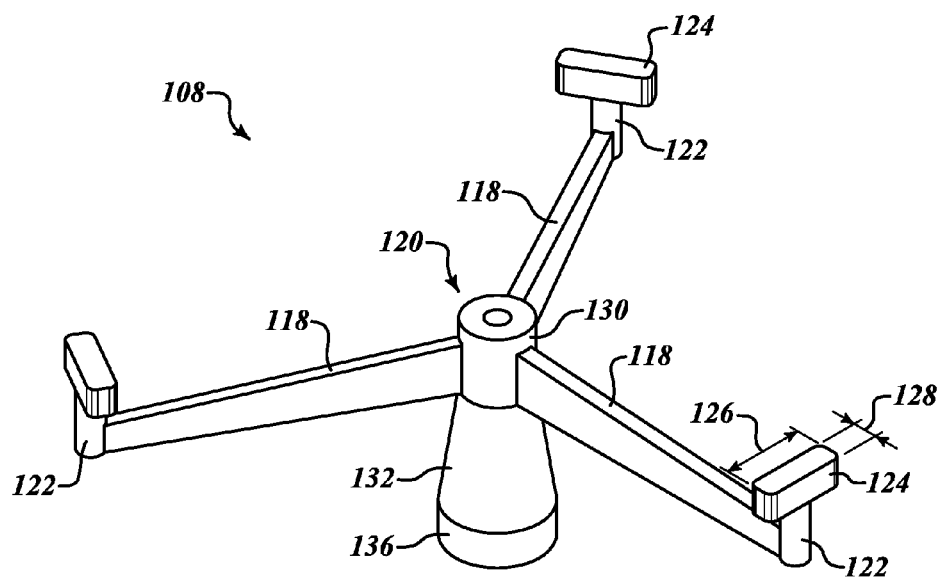
FIG. 3 is a three-dimensional view of a susceptor support in accordance with one embodiment of the present disclosure.

FIG. 3 is a three-dimensional view of a susceptor support 108 formed in accordance with an embodiment of the present disclosure. The susceptor support 108 has a plurality of arms 118 extending radially from a hub 120. In this embodiment, there are three arms 118 positioned around the hub 120 and separated from each other by 120 degrees. Each arm has a terminal end 122 on which an elongated rectangular tip 124 is formed. The terminal ends 122 may be posts attached to the plurality of arms 118 or they may be formed as extensions of the same material as the arms 118. The terminal ends 122 are transverse to a central axis of the arm 118 with which each terminal end is associated.

Each elongated rectangular tip 124 is positioned on the terminal ends 122 of each arm 118. Each tip 124 has a length 126 and a width 128. The length of the tip is greater than the width of the tip. The length 126 of the tip 124, like the terminal end 122, is transverse to the central axis of the associated arm 118. A central axis of the terminal end 122 and a central axis of the 122 can be in alignment. Each tip has rounded edges to prevent the quartz from chipping. These three arms with their three tips bear the weight of the susceptor and provide the contact points with which the susceptor is rotated during the CVD process.

In one embodiment, a ratio of the length 126 to the width 128 is greater than or equal to one to three. For example, the length 126 may be 15 millimeters while the width 128 is 5 millimeters.

The hub 120 has a narrow upper portion 130 and a central angled portion 132. The plurality of arms 118 extend radially from the upper narrow portion 130. The hub may also include a lower portion 136 that extends from the central angled portion 132.

Figure 4:
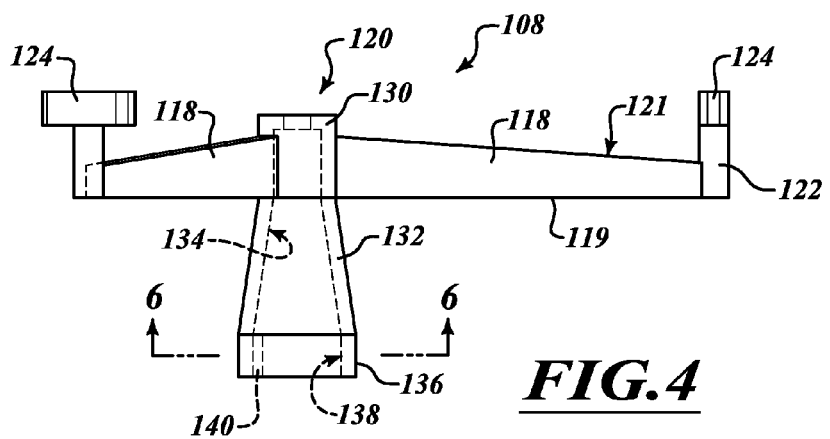
FIG. 4 is a side view of the susceptor support of FIG. 3.

FIG. 4 is a side view of the susceptor support 108 having the plurality of arms 118 extending from the hub 120. Each arm 118 has a bottom surface 119 that is transverse to a central axis of the hub 120. In one embodiment, the bottom surface 119 is perpendicular to the central axis. An upper surface 121 of each arm is angled from the hub 120 down to the terminal end 122. The arms 118 may be thicker closer to the hub 120 to adequately support the weight of the susceptor being transferred from the tips 124.

The central angled portion 132 is hollow, as shown by the dotted lines in FIG. 4, such that angled interior sidewalls form interior surfaces 134 form. The lower portion 136 is also hollow and has interior sidewalls 138, which have a consistent circumference. A ridge 140 is formed on the interior sidewalls 138. In one embodiment, the ridge extends a full length of the interior surface 138 of the lower portion 136. In an alternative embodiment, the ridge 140 extends between a position on the interior surface 138 of the lower portion 136 to a position on the interior surface 134 of the central angled portion 132.

Figure 5:
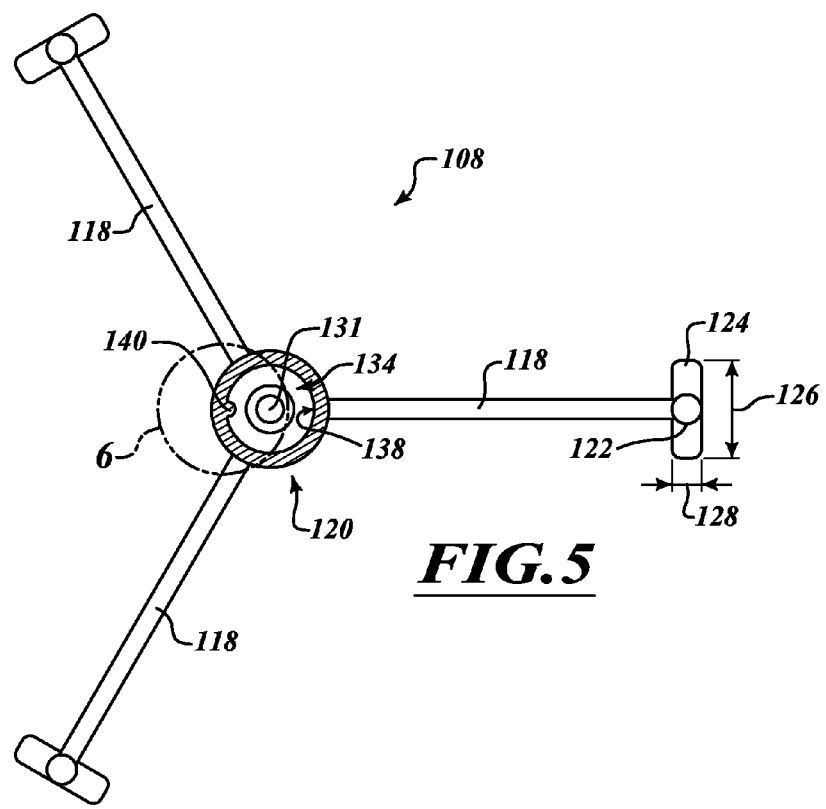
FIG. 5 is a bottom view of the susceptor support of FIG. 3.

FIG. 5 is a bottom view of the susceptor support 108 having the plurality of arms 118 extending radially from the hub 120. The hub 120 includes the interior sidewalls 138 of the lower portion 136. The interior sidewalls 138 have the ridge 140 formed thereon, extending toward the central axis of the hub 120. The upper narrow portion 130 may also be hollow, forming interior surface 131. The angled interior surface 134 can be seen extending between the lower interior sidewalls 138 and the upper interior surface 131.

In one embodiment, each arm 118 is 63.63 mm in length from a central axis of the hub 120 to the terminal end 122 of the arm 118. The length 126 of the tip 124 may be 15 mm while the width 128 of the tip 124 is 5.5 mm. Edges of the tip 124 may be curved at a radius of 1.5 degrees. This curvature prevents the quartz material from chipping during positioning of the susceptor 106 on the susceptor support 108.

Figure 6:
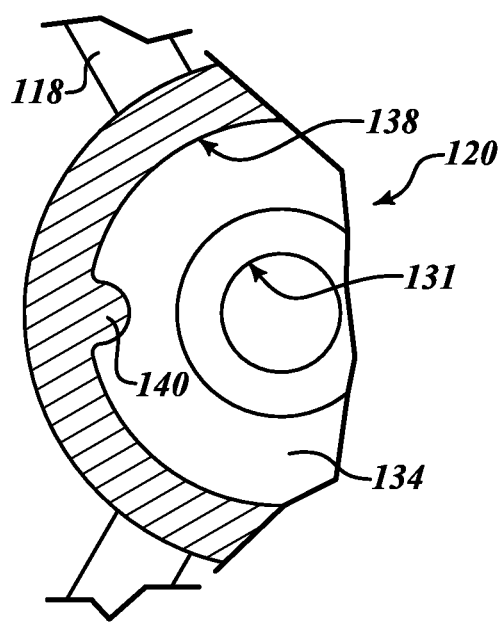
FIG. 6 is an enlarged view of a portion of a hub of the susceptor support of FIG. 5.

FIG. 6 is an enlarged view of the hub 120 that shows the ridge 140 formed on the interior surface 138. The ridge 140 has a curvature toward the central axis of the hub 120. The interior surfaces of the hub 120 are configured to interact with tapered end of the shaft, described in more detail in FIGS. 7-13. The ridge 140 has a radius of curvature that corresponds to a groove in the shaft, which is also described below. In an alternative embodiment, the ridge has a rectangular shape.

FIG. 7 is a side view of the cylindrical shaft 110. The shaft 110 has a first tapered end 142 that is configured to be received inside the hub 120 of the susceptor support 108 and a second end 144 to be received in the motor 112. The motor 112 turns the shaft 110 which turns the susceptor support 108 during the deposition process in the chemical vapor deposition machine 100.

The first tapered end 142 angles down from a first surface 143 to an upper portion 146 of the shaft 110. Most of the shaft is hollow, where each portion of the shaft has a different circumference. The first surface 143 has a first circumference 148 that is smaller than a second circumference 150 of the upper portion 146. The second end 144 has a third circumference 154 that is larger than the second circumference 150 of the upper portion 146. The first, second, and third circumferences 148, 150, and 154 are illustrated in cross-sectional views of the shaft in FIGS. 9, 11, and 13.

The second end 144 and upper portion 146 of the shaft 110 are hollow and are configured to receive a thermocouple (not shown) attached to the motor 112 and received through the shaft 110 through an opening 158 in the second end 144.

In one embodiment, the shaft from the first surface 143 to the end of the second end 144 is 375 millimeters. The second end 144 from the tapered portion 160 to the opening is 168 millimeters.

FIG. 8 is another side view of the shaft 110 illustrating the first end 142 that tapers down to the upper portion 146. A groove 156 is formed extending between the first end 142 and the upper portion 146. The groove 156 is on both the tapered edge of the first end 142 and on the upper portion 146 of the shaft 110.

The first end 142 of the shaft 110 has the tapered edges in order to be received in central angled portion 132 the hub 120 of the susceptor support 108. The tapered edges are in contact with the interior surfaces 134 of the central angled portion 132 of the hub 120. The ridge 140 formed on the interior surfaces 134 or 138 of the hub 120 is slideably received into the groove 156 on the shaft 110. The ridge and groove form a locking mechanism that prevents the shaft from slipping while engaged with the hub 120. The locking mechanism prevents slippage due to the degradation from hydrochloric gas and friction.

FIG. 9 is a top view of the shaft 110 of in the first tapered end 144 of the shaft 110. The first surface 143 is in the center of the figure. The first circumference 148 is around the first surface 143. The second circumference 150 extends around the first circumference 148. The groove 156 is also visible from this view. The first tapered end 144 is of a conical shape and configured to couple to the susceptor support. The groove, into which the ridge in the susceptor support's hub slides in, is formed parallel to the length of the shaft and cut into part of the upper portion. As the shaft is inserted into the hub, the ridge would slide into the grove before coming to rest when the fit is secure.

FIG. 10 is an enlarged side view of the transition between the upper portion 146 and the lower portion 152 of the shaft 110. The transition from the second circumference 150 to the third circumference 154 is transitioned with a tapered edge 160.

FIG. 11 is a cross-sectional view of the upper portion 146 of the shaft 110 showing the second circumference 150 and a hollow opening 162. The second opening 162 is smaller than the first opening 158. The thermocouple not shown in the figures is configured to be slideably received by the first opening 158 and the second opening 152.

FIG. 12 is an enlarged view of the first end 142 and a second of the upper portion 146 having the groove 156. The groove 156 is an indentation into the shaft that is configured to receive the ridge 140 of the hub 120. The ridge 140 may be elongated to extend within a length of the groove 156. In an alternative embodiment, the ridge 140 can be only a small portion of the length of the groove 156.

FIG. 13 is a cross-sectional view of the shaft 110 through 13-13 in FIG. 8. The third circumference 154 is illustrated in FIG. 7 to be larger than the internal circumference of the hollow opening 158. An motor groove 155 is provided for alignment of the shaft 110 in the motor 112. The motor groove 155 may also be used to turn the shaft 110.

Figure 14:
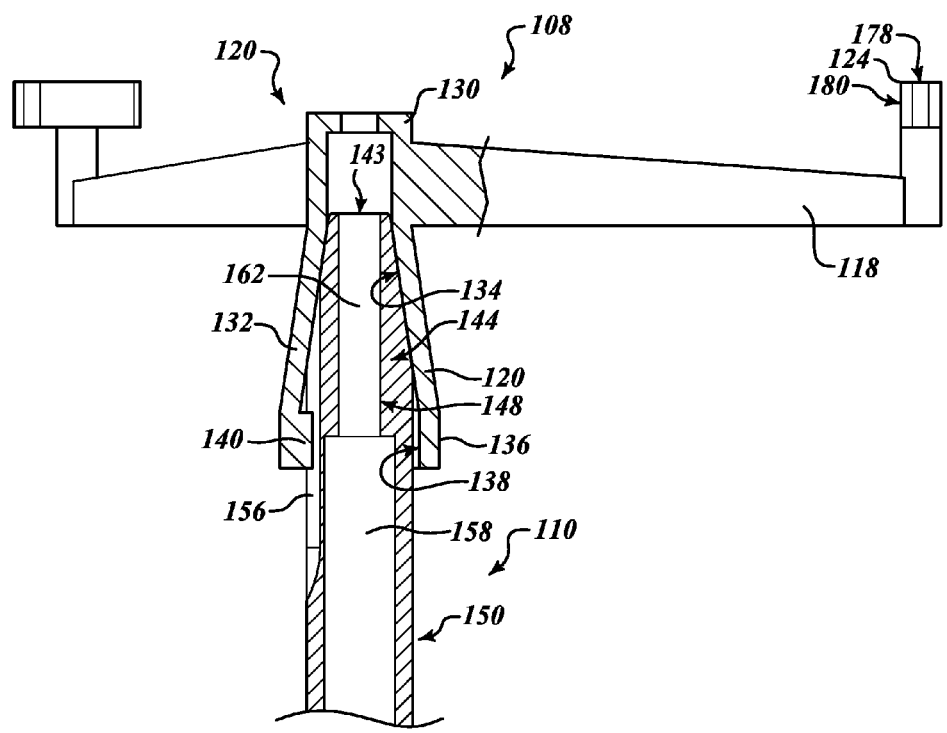
FIG. 14 is a cross-sectional view of a shaft coupled to a susceptor support in accordance with an embodiment of the present disclosure.

FIG. 14 is a cross-sectional view of the susceptor support 108 positioned on the shaft 110. The groove 156 in the shaft 110 is positioned to receive the ridge 140 of the hub 120. When the ridge 140 and the groove 156 are slideably engaged, the susceptor support 108 is more securely attached to the shaft 110 and slippage is less likely to occur. Over time, the ridge 140 and groove 156 configuration will not degrade in the hydrochloric gas in the reaction chamber 102 and this will extend the life of the susceptor support 108 and the shaft 110.

More particularly, when the ridge 140 is engaged in the groove 156, the susceptor support 108 turns when the shaft 110 is turned by the motor 112. If the ridge 140 is an elongated ridge, the lifetime of the susceptor support 108 can be increased because the more material used to form the ridge increases the time it takes to degrade the ridge and impact the stability of the locking mechanism.

As seen in FIG. 14, the first tapered end 144 is received by the central angled portion 132. The groove 156 extends up into the first tapered portion 144 so that the ridge 140 can easily slide into position in the groove. In one embodiment, the surfaces of the first tapered end 144 are in contact with the interior surfaces 134 of the central angled portion 132 of the hub 120. In another embodiment, there may be air between the surfaces of the first tapered end 144 and the interior surfaces 134 of the central angled portion 132. The ridge 140 and groove 156 locking mechanism allow for less precise formation of the susceptor support and the shaft because the tolerances for the ridge and groove can ensure that the shaft will turn the susceptor.

Also shown in FIG. 14 is a top surface 178 of the tip 124. In one embodiment, the tip surface of the tip is substantially flat. In an alternative embodiment, the top surface 178 of the tip can have a slight curvature from a top peak of the top surface down to where the top surface joins the sides.

As described above, the susceptor support couples to the rotatable shaft which transfers the rotating force from a motor inside the process chamber to the susceptor support. The susceptor support device supports the susceptor from the second side through direct contact with an interior surface of the groove. A weight of the susceptor keeps the susceptor in contact with the tips of the susceptor support. The contact of the tips with the susceptor is sufficient to cause the susceptor to turn when the shaft turns the susceptor support.

This shaft is mated to the inside of the susceptor support hub to provide a coupling that rotates the susceptor support when the shaft is rotated. A lose coupling means wobbling and this leads to an uneven turning of the susceptor support, which also means an uneven turning of the susceptor that would create uneven processing of the wafer. To ensure sustained coupling, the ridge and groove mechanism is used in mating the shaft to the hub. The ridge is sized so that it can slide into the groove when the shaft is inserted into the hub, and stays in an engaged position as the shaft is rotated. This engaged position prevents rotational slippage and wobbling while making sure that the susceptor support is locked to the rotational drive with respect to the rotationally and horizontally applied forces.

Figure 15A:
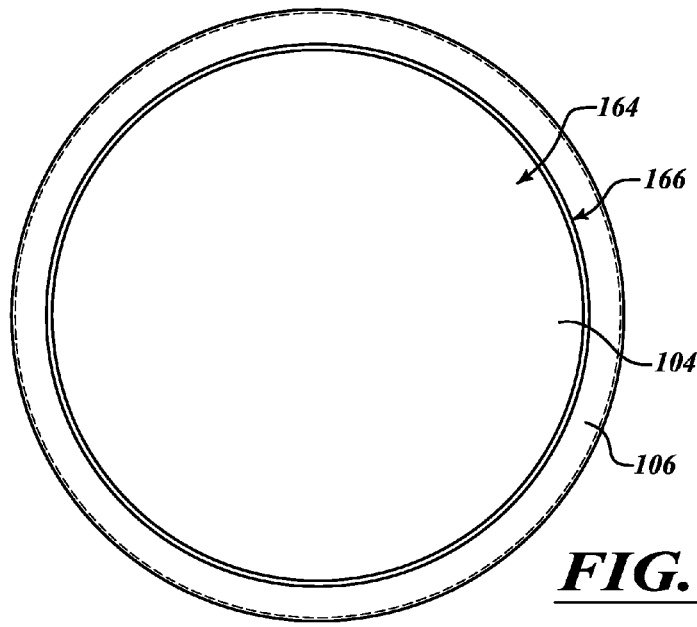
FIG. 15A is a top view of a susceptor.

FIG. 15A is a top down view of the susceptor 106 used to support the wafer 104 in the deposition reaction chamber 102. The top surface 164 of the susceptor 106 can include a lip 166 that holds the wafer 104 in place as the susceptor 106 spins in the reaction chamber 102. The susceptor 106 is configured to evenly heat the wafer 104 to assist in the deposition process. If the susceptor wobbles due to degradation of the quartz tips, the wafer can be shifted out of the lip. If the wafer is shifted out of the lip, the wafer can be damaged or ruined. Any shift causes uneven deposition, which is problematic for subsequent process steps.

Figure 15B:
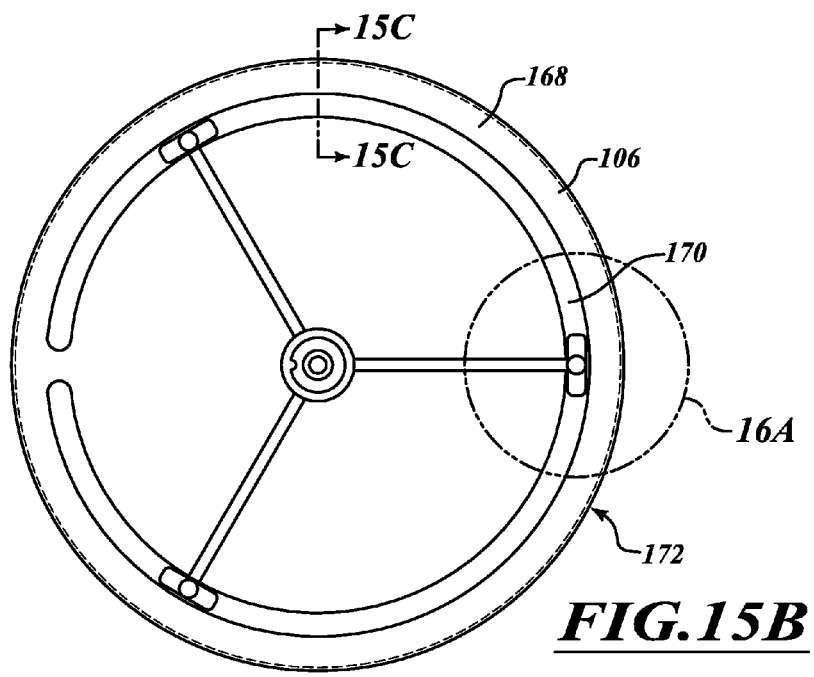
FIG. 15B is a bottom view of the susceptor of FIG. 15A.

FIG. 15B is a back surface 168 of the susceptor 106 with a C-shaped groove 170 that is configured to receive the plurality of tips 124 of the susceptor support 108. The C-Shaped groove 170 can be a continuous groove on the back surface 168 of the susceptor. The groove 170 is spaced from an outer edge 172 of the susceptor 106. The distance from the edge 172 to the groove 170 corresponds to a length of the plurality of arms 118 of the susceptor support 108. The distance can vary per length of the arms 118.

The susceptor 106 is a circular disk of certain thickness, which is typically made of graphite. The wafer sits within the lip on the first surface 166 of the susceptor, which leaves the wafer exposed to an upper portion of the chamber. The second surface 168 of the susceptor 106 faces a bottom portion of the chamber, which includes the motor and shaft. The susceptor 106 has a weight substantial enough to create a downward force on the tips 120 of the susceptor so that the susceptor support 108 can turn the susceptor.

Figure 15C:
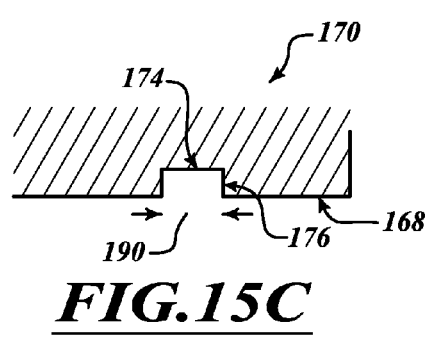
FIG. 15C is a cross-sectional view of the susceptor of FIGS. 15A and 15B.

FIG. 15C is a cross-sectional view through the groove 170 of the susceptor 106. The groove 170 has a substantially flat surface 174 that is recessed from the back surface 168 of the susceptor 106. The groove 170 has sidewalls 176 that are transverse to the substantially flat surface 174. In one embodiment, corners where the sidewalls 176 and the flat surface 174 interact are curved. More particularly, the groove 170 can have a smooth curvature into the second surface. The C-shaped groove forms an opening or cavity configured to receive multiple tips of a susceptor support, and this opening has a width and a depth.

The top surface 178 of the tip 124 is configured to interact with the flat surface 174 of the groove 170. The elongated rectangular shape of the tip 124 having the length 126 and the width 128 provide for additional stability of the tip when positioned in the groove 170 on the back surface 168 of the susceptor 106. Having the elongated top surface 178 provides additional surface area of the tip 124 that is available for interaction with the flat surface 174 of the groove 170. Sides of the tip 180 may be spaced from the sidewalls 176 of the groove when the top surface 178 of the tip 124 is positioned in contact with the flat surface 174 of the groove 170. A width 190 of the groove 170 is larger than the width 128 of the tip 124. For example, the width may be 6.5 mm.

In the embodiment illustrated in FIG. 15C, having the substantially flat surface 174, the tips of the susceptor support 108 may have the flat contact surface 178 as shown in FIG. 14. The flat surface to flat surface contact provides a stable support, and at the same time, such surface reliably transfers a horizontally applied force to rotate the susceptor.

The contact between the susceptor support tips with the graphite susceptor may deteriorate after certain period, such as after 10,000 wafer runs. The combination of chemical gas, weight, and friction tend to wear these tips. Worn tips lose their grips on the susceptor, causing slippage, wobbling and uneven deposition. However, these elongated rectangular tips do not degrade after 10,000 wafer runs. The saves replacement costs and makes the deposition process more efficient.

Figure 16A:
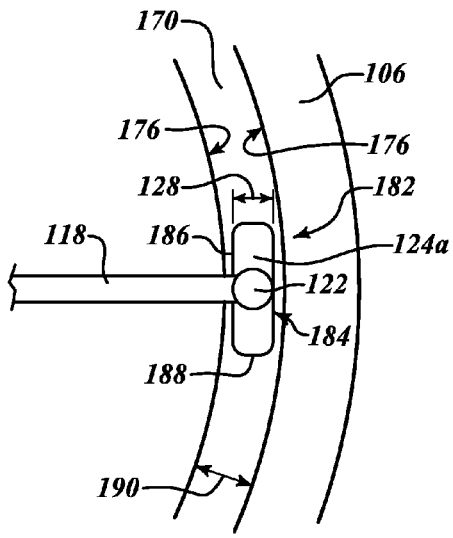
FIG. 16A-16C are various embodiments of a tip positioned within a groove on a back side of a susceptor, formed in accordance with an embodiment of the present disclosure.

FIG. 16A is a bottom view of one embodiment of a tip 124a positioned within the groove 170 on the susceptor 106. A first side 186 of the tip 124a transitions to a second side 188 of the tip with curved transitional edges. This tip 124a is sized and shaped such that entire tip can fit within the groove 170 without contacting the sidewalls. The width 190 of the groove 170 is larger than the width 128 of the tip 124a. The fewer contact points between the tip and the groove 170 can improve the life of the tip because there are fewer friction points. The difference in the width 128 of the tip 124 and the width 190 of the groove 170 provides clearance to simplify the positioning of the susceptor 106 on the susceptor support 108.

Figure 16B:
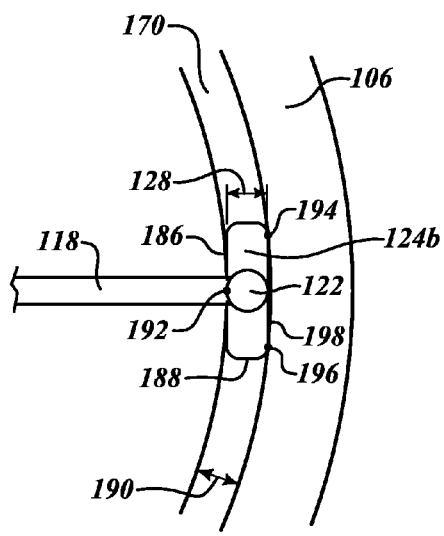

FIG. 16B is another tip 124b formed in accordance with an embodiment of the present disclosure. The width 190 of the groove 170 and the width 128 of the tip 124b are very similar in size. The width 190 is only slightly larger than the width 128 of the tip. Accordingly, several points of the tip 124b make contact with the inner surface 176 of the groove 170. For example, a first point 192 on the first side 186 of the tip 124b contacts the inner surface 176 adjacent where the arm 118 contacts the terminal end 122. A second point 194 and a third point 196 on a third side 198 contact the inner surface 176 of the groove 170.

Figure 16C:
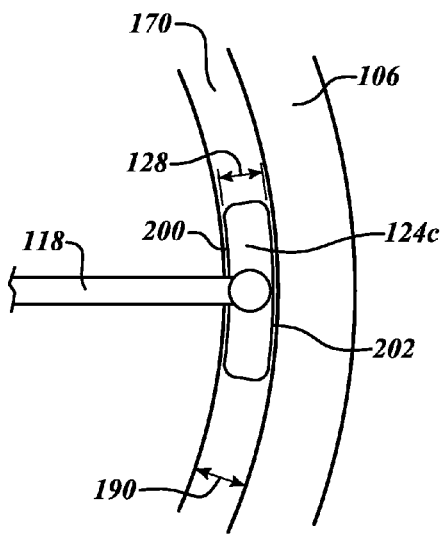

FIG. 16C is another embodiment of a tip 124c in the groove 170 of the susceptor 106. The tip has a first curved side 200 and a second curved side 202. The second curved side is longer than the first curved side 200. The width 128 of the tip 124c is less than the width 190 of the groove 170. The width 128 is also less than first and second widths of the first and second curved sides 200, 202, respectively. By forming the tip 124c to have a curvature that is compatible with the curvature of the groove, the tip 124c can be more elongated thereby providing more surface area onto which the susceptor can rest. The more surface area can result in less degradation over time. However, the manufacturers must balance the extent of the elongation with costs associated with forming the quartz tips.

Forming the tip to have the first and second curved surfaces 184, 186 prevents any edges of the tip 182 from repeatedly rubbing against the sidewalls 176 of the groove 170. This will extend the operational lifetime of the tip 182 by reducing the number of contact points that are exposed to friction with the groove.

When assembled in the chemical vapor deposition machine 100, the weight of the susceptor 106 is sufficient downward force to enable the susceptor support 108 to interact with the back surface 178 of the susceptor 106 to turn the susceptor when the shaft turns.

Hydrochloric gas used in the deposition chamber 102 slowly degrades the susceptor support 108 and the shaft 110 through a series of deposition processes. The degradation causes warpage or curvature of edges of the tip which causes the susceptor 106 to wobble when engaged with the tip 124. Any wobbling or other stability issues of the susceptor can cause irregularities in the deposition process which then impacts the operational quality of the devices on the wafer 104. By enlarging the tip to have the length 126 that is larger than the width 128, the tip is less prone to degradation by the abrasive and eroding chemicals used in the deposition chamber 102. In one embodiment, the elongated tip 124 can withstand more than 10,000 wafer runs in the reaction chamber 102. The tip 124 can last significantly longer than previous designs. The elongated tip 124 has no significant deterioration detected after the 10,000 wafer runs. By eliminating the problem of wobbling, the problem of the wafer 104 slipping outside of the lip 166 on the top surface 164 of the susceptor is also eliminated.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A susceptor support, comprising:
a hub;
a plurality of arms extending radially from the hub, each arm having a terminal end positioned away from the hub, each arm having a length between the hub and the terminal end; and
a plurality of solid elongated rectangular tips formed at the terminal end of each arm, a top surface of each tip is configured to contact an interior surface of a groove in a susceptor, the top surface being rectangular and having a length and a width, wherein the length is greater than the width, the length extending in a direction that is transverse to the length of a respective one of the arms, the elongated rectangular tips being configured to prevent degradation of the tip and to prevent uneven rotation of the susceptor during use.

2. The susceptor support of claim 1 wherein each arm has a central axis extending away from the hub along the length of each arm and the length of each tip is perpendicular to the central axis.

3. The susceptor support of claim 1 wherein sides of the tip are curved.

4. The susceptor support of claim 1 wherein a ratio of the length to the width is greater than one to three.

5. The susceptor support of claim 1 wherein the hub has a bottom portion and a top portion, the bottom portion having an opening, a width of the bottom portion being greater than a width of the top portion, and interior surface of the bottom portion including a ridge configured to hold the hub in place during use and each arm has a central axis associated with the length of each arm and extending radially away from the top portion of the hub, the length of each tip is perpendicular to the central axis.

6. The susceptor support of claim 1 wherein the tip has a first elongated side facing the hub, transverse to the top surface, and a second elongated side positioned opposite from the first elongated side, transverse to the top surface, the first and second elongated sides having a curvature.

7. A susceptor support system for use in a deposition chamber, comprising:
a susceptor having a first surface and a second surface, the second surface having a single groove;
a susceptor support configured to support and rotate the susceptor through interaction with an interior surface of the groove, the susceptor support including:
a hub;
a plurality of arms extending radially from the hub, each arm having a terminal end extending away from the hub, each arm having a length between the hub and the terminal end; and
a plurality of solid elongated rectangular tips formed at the terminal end of each arm, each tip having a top surface that is rectangular and has a length and a width, wherein the length is greater than the width, the length of the top surface being transverse to the length of each arm, the rectangular tips being configured to fit in the groove in the second surface of the susceptor, the top surface of the tips being configured to interact with the interior surface of the groove.

8. The susceptor support system of claim 7, wherein the groove is spaced from a center of the hub by a distance, wherein the distance corresponds to the length of each arm of the susceptor support.

9. The susceptor support system of claim 7 wherein the groove is circular and C-shaped.

10. The susceptor support system of claim 7 wherein a ratio of the length to the width is greater than one to three.

11. The susceptor support system of claim 7, further comprising a shaft having a groove formed in an upper portion.

12. The susceptor support system of claim 11 wherein the hub has an opening configured to receive the upper portion of the shaft, the hub having an interior surface that includes a ridge that is configured to be received by the shaft.

13. A susceptor support assembly, comprising:
a hub having a bottom portion and a top portion, the bottom portion having an opening, a width of the bottom portion being greater than a width of the top portion, and interior surface of the bottom portion including a ridge configured to hold the hub in place during use;
a plurality of arms extending radially from the top portion of the hub, each arm having a terminal end positioned away from the hub, each arm having a length extending from the hub to the terminal end;
a plurality of elongated rectangular tips formed at the terminal end of each arm, a top surface of each tip being rectangular and being configured to contact an interior surface of a groove in a susceptor, the top surface having a length and a width, wherein the length is greater than the width, the elongated rectangular tips configured to prevent degradation of the tip and to prevent uneven rotation of the susceptor during use, the length of each rectangular tip extending in a direction that is transverse to the length of a respective one of the arms; and
a shaft having an indentation formed in an upper portion, the opening in the hub configured to receive the upper portion of the shaft, and the indentation being configured to receive the ridge to hold the hub in place during use.

14. The susceptor support assembly of claim 13 wherein a ratio of the length to the width is greater than one to three.

15. The susceptor support assembly of claim 13 wherein length of each arm is perpendicular to the length of the top surface of each tip.

16. The susceptor support assembly of claim 13 wherein the ridge of the hub is configured to couple a rotation of the susceptor with a rotation of the shaft.

* * * * *